US007301315B2

(12) United States Patent
Noda

(10) Patent No.: US 7,301,315 B2
(45) Date of Patent: Nov. 27, 2007

(54) POWER SUPPLYING METHOD AND APPARATUS INCLUDING BUFFER CIRCUIT TO CONTROL OPERATION OF OUTPUT DRIVER

(75) Inventor: Ippei Noda, Ikeda (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 11/029,723

(22) Filed: Jan. 5, 2005

(65) Prior Publication Data

US 2005/0151527 A1 Jul. 14, 2005

(30) Foreign Application Priority Data

Jan. 5, 2004 (JP) ............................ 2004-000446

(51) Int. Cl.
*G05F 1/00* (2006.01)
*H03F 3/45* (2006.01)

(52) U.S. Cl. ...................................... 323/280; 330/257

(58) Field of Classification Search ................ 323/273, 323/274, 280, 281, 315, 316, 275, 277, 269, 323/270; 330/257, 264, 253, 255

See application file for complete search history.

(56) References Cited

U.S. PATENT DOCUMENTS 5,144,518 A * 9/1992 Miyazaki ..................... 361/56
5,990,742 A * 11/1999 Suzuki ....................... 330/253
6,046,577 A * 4/2000 Rincon-Mora et al. ..... 323/282
6,177,811 B1 * 1/2001 Fuse et al. .................. 326/119
6,342,814 B1 * 1/2002 Suzuki ....................... 330/225
6,407,537 B2 * 6/2002 Antheunis ................... 323/312
6,465,994 B1 * 10/2002 Xi ............................. 323/274
6,573,694 B2 * 6/2003 Pulkin et al. ............... 323/273
6,897,637 B2 * 5/2005 Chen et al. ................. 323/274
7,053,597 B2 * 5/2006 Lin et al. .................... 323/316
7,176,753 B2 * 2/2007 Noda et al. ................. 327/543
7,183,852 B2 * 2/2007 Abe ........................... 330/257

FOREIGN PATENT DOCUMENTS

JP 10-124159 5/1998

OTHER PUBLICATIONS

Sedra and Smith, Microelectronic Circuits, Third Edition, 1991, Saunders College Publishing, pp. 455-456.*

* cited by examiner

*Primary Examiner*—Karl Easthom
*Assistant Examiner*—Harry Behm
(74) *Attorney, Agent, or Firm*—Cooper & Dunham, LLP

(57) ABSTRACT

A power supply circuit includes an output driver transistor, a reference voltage generator circuit, an output voltage detector circuit, an amplifier circuit, and a buffer circuit. The output driver transistor outputs a current in accordance with a first control signal input thereto. The reference voltage generator circuit generates a predetermined reference voltage. The output voltage detector circuit detects an output voltage and outputs a divided voltage generated based on the output voltage. The amplifier circuit has a first polarity and a second polarity opposite to the first polarity and compares the predetermined reference voltage and the divided voltage and outputs a second control signal. The buffer circuit receives the second control signal and controls the operation of the output driver transistor in accordance with the second control signal. The buffer circuit includes first and second transistors having a polarity same as the second polarity of the amplifier circuit.

14 Claims, 5 Drawing Sheets

POWER SUPPLYING METHOD AND APPARATUS INCLUDING BUFFER CIRCUIT TO CONTROL OPERATION OF OUTPUT DRIVER

BACKGROUND

1. Field

The present invention relates to a power supply circuit. Particularly, the present invention relates to a power supply circuit that employs a series regulator, and quickly responds to steep changes in load current so that changes in output voltage can be reduced.

2. Discussion of the Background

Some background power supply circuits use a series regulator. The series regulator has a relatively low efficiency due to a relatively large power consumption of a transistor when electric power is applied to a load that consumes a relatively large current. The series regulator, however, is capable of easily raising an output voltage and quickly responding to variations in an input voltage and a load fluctuation. In addition, the series regulator has a relatively high stability of the output voltage.

Referring to FIG. 1, a schematic circuit configuration of a background power supply circuit 100 that uses a series regulator is described.

In FIG. 1, the background power supply circuit 100 includes a reference voltage regulator 101, resistors Ra and Rb, an error amplifier 102 and an output driver transistor Me.

The reference voltage regulator 101 generates and outputs a given reference voltage VrA.

The resistors Ra and Rb detect and divide an output voltage Vout to generate and output a divided voltage VdA.

The error amplifier 102 includes n-channel metal oxide semiconductor (hereinafter referred to as "NMOS") transistors Ma and Mb, p-channel metal oxide semiconductor (hereinafter referred to as "PMOS") transistors Mc and Md, and a constant current source ia, and compares the divided voltage VdA and the reference voltage VrA. The PMOS transistors Mc and Md form a current mirror circuit.

The output driver transistor Me performs operations controlled by the error amplifier 102.

Operations of the background power supply circuit 100 are now described.

In a steady operation state, the error amplifier 102 controls the output driver transistor Me to make the divided voltage VdA equal to the reference voltage VrA, thereby stabilizing the output voltage Vout in a condition that a constant current is supplied to a load 110.

If the output current iout rapidly decreases in the steady operation state, the output voltage Vout rises. An increased amount of the output voltage Vout is divided by the resistors Ra and Rb to generate and output the divided voltage VdA. The divided voltage VdA is fed back to the NMOS transistor Mb of the error amplifier 102, which turns on the NMOS transistor Mb.

Since the PMOS transistors Mc and Md form a current mirror circuit, a total amount of current supplied from the PMOS transistors Mc and Md becomes larger than an amount of current supplied from the constant current source ia. Subsequently, a gate voltage of the output driver transistor Me becomes larger by an excess amount of current supplied from the PMOS transistors Mc and Md. This turns off the output driver transistor Me, with the result that the output voltage Vout falls.

Thus, the output driver transistor Me is controlled to adjust the divided voltage VdA to become equal to the reference voltage VrA so that the operation state may become steady, thereby stabilizing the output voltage Vout.

On the other hand, if the output current iout rapidly increases in the steady operation state, the output voltage Vout drops. The reduced amount of the output voltage Vout is divided by the resistors Ra and Rb to generate and output a divided voltage VdA. The divided voltage VdA is fed back to the NMOS transistor Mb of the error amplifier 102, which turns off the NMOS transistor Mb.

With the above-described operation, a total amount of current supplied from the PMOS transistors Mc and Md becomes smaller than the amount of current supplied from the constant current source ia. Since the gate voltage of the output driver transistor Me becomes smaller by a reduced amount of current supplied from the PMOS transistors Mc and Md, the output driver transistor Me is turned on to raise the output voltage Vout.

Thus, the output driver transistor Me is controlled to adjust the divided voltage VdA to become equal to the reference voltage VrA so that the operation state may become steady, thereby stabilizing the output voltage Vout.

In the power supply circuit 100 of FIG. 1, when the output current iout rapidly decreases, the PMOS transistor Mc is allowed to immediately charge an electric charge to be stored in a capacitor parasitic at a gate of the output driver transistor Me so as to stabilize the output voltage Vout.

However, when the output current iout rapidly increases, the output voltage Vout needs longer time to be stabilized, because the operation depends on the constant current source ia when discharging an electric charge stored in the capacitor parasitic at the gate of the output driver transistor Me.

To accelerate the stabilization of the output voltage Vout, a current supply capacity of the constant current source ia is increased. This allows a large amount of constant current to flow to the error amplifier 102, which increases consumption current of the power supply circuit 100.

Referring to FIG. 2, a schematic circuit configuration of a background power supply circuit **100*a*** that uses a series regulator is described.

In FIG. 2, the background power supply circuit **100*a* includes a reference voltage regulator 111, resistors Rc and Rd, an error amplifier 112** and an output driver transistor Mj.

The reference voltage regulator 111 generates and outputs a given reference voltage VrB.

The resistors Rc and Rd detect and divide an output voltage Vout to generate and output a divided voltage VdB.

The error amplifier 112 includes PMOS transistors Mf and Mg, NMOS transistors Mh and Mi, and a constant current source ib, for comparing the divided voltage VdB and the reference voltage VrB. The NMOS transistors Mh and Mi form a current mirror circuit.

The output driver transistor Mj performs operations controlled by the error amplifier 112.

Operations of the background power supply circuit **100*a*** are now described.

In a steady operation state, the error amplifier 112 controls the output driver transistor Mj to make the divided voltage VdB equal to the reference voltage VrB, thereby stabilizing the output voltage Vout in a condition that a constant current is supplied to a load 110.

If the output current iout rapidly increases in the steady operation state, the output voltage Vout falls. A reduced amount of the output voltage Vout is divided by the resistors Rc and Rd to generate and output the divided voltage VdB.

The divided voltage VdB is fed back to the PMOS transistor Mg of the error amplifier 112, which turns on the PMOS transistor Mg.

Since the NMOS transistors Mh and Mi form the current mirror circuit, a total amount of current supplied from the NMOS transistors Mh and Mi becomes larger than an amount of current supplied from the constant current source ib. Subsequently, a gate voltage of the output driver transistor Mj becomes smaller by an excess amount of current supplied from the NMOS transistors Mh and Mi. This turns on the output driver transistor Mj, with the result that the output voltage Vout rises.

Thus, the output driver transistor Mj is controlled to adjust the divided voltage VdB to become equal to the reference voltage VrB so that the operation state may become steady, thereby stabilizing the output voltage Vout.

On the other hand, if the output current iout rapidly decreases in the steady operation state, the output voltage Vout rises. The increased amount of the output voltage Vout is divided by the resistors Rc and Rd to generate and output a divided voltage VdB. The divided voltage VdB is fed back to the PMOS transistor Mg of the error amplifier 112, which turns off the PMOS transistor Mg.

With the above-described operation, a total amount of current supplied from the NMOS transistors Mh and Mi becomes smaller than the amount of current supplied from the constant current source ib. A difference of amount between the output driver transistor Mj and the NMOS transistors Mh and Mi may be a trigger to turn off the output driver transistor Mj, with the result that the output voltage Vout falls.

Thus, the output driver transistor Mj is controlled to adjust the divided voltage VdB to become equal to the reference voltage VrB so that the operation state may become steady, thereby stabilizing the output voltage Vout.

In the power supply circuit 100*a* of FIG. 2, when the output current iout rapidly increases, the NMOS transistor Mh is allowed to immediately discharge an electric charge stored in a parasitic capacitor at a gate of the output driver transistor Mj so as to stabilize the output voltage Vout.

However, when the output current iout rapidly decreases, the output voltage Vout needs longer time to be stabilized, because the operation depends on the constant current source ib when charging an electric charge into the parasitic capacitor at the gate of the output driver transistor Mj.

To accelerate the stabilization of the output voltage Vout, a current supply capacity of the constant current source ib needs to be increased. This, however, allows a large amount of constant current to flow to the error amplifier 112, which increases consumption current of the power supply circuit 100*a*.

Referring to FIG. 3, a schematic circuit configuration of a background power supply circuit 100*b* is described.

The background power supply circuit 100*b* of FIG. 3 uses a technique in which a constant voltage power source provided in the background power supply circuit 100*b* controls the output voltage to have a relatively fast speed of response.

In FIG. 3, the background power supply circuit 100*b* includes a current supply circuit 130, a current attraction circuit 140 and a feedback voltage power supply 150.

The current supply circuit 130 and the current attraction circuit 140 are connected at a voltage output terminal TO of the feedback voltage power supply 150.

The current supply circuit 130 includes a voltage source 131, a current source 132, a first diode 133 and a second diode 134.

The voltage source 131 generates an output voltage VL that is smaller than a working voltage of the voltage output terminal TO. The first diode 133 has a cathode connected to the voltage output terminal TO. The second diode 134 has a cathode connected to the voltage source 131. The current source 132 has a current output terminal that is connected to a connecting point of an anode of the first diode 133 and an anode of the second diode 134.

The current attraction circuit 140 includes a voltage source 141, a current source 142, a third diode 143 and a fourth diode 144. The voltage source 141 generates an output voltage VH that is larger than a working voltage of the voltage output terminal TO. The third diode 143 has an anode connected to the voltage output terminal TO. The fourth diode 144 has an anode connected to the voltage source 141. The current source 142 has a current output terminal that is connected to a connecting point of a cathode of the third diode 143 and a cathode of the fourth diode 144.

The background power supply circuit 100*b* generally maintains a relationship that an output voltage Vo of the voltage output terminal TO is smaller than the output voltage VH of the voltage source 131 and is larger than the output voltage VL of the voltage source 141. The relationship may be described in a relational expression of VH>Vo>VL. When the above-described relationship is maintained, an output current of the current source 132 flows to the voltage source 131, an output current of the current source 142 flows to the voltage source 141, and no current flows to the voltage output terminal TO.

When the output voltage Vo of the voltage output terminal TO decreases, the output voltage Vo becomes smaller than the output voltage VL. At this time, the current source 132 generates a current and supplies the current to the voltage output terminal TO to prevent the output voltage Vo from becoming smaller than the output voltage VL.

When the output voltage Vo of the voltage output terminal TO increases, the output voltage Vo becomes larger than the output voltage VH. At this time, the current source 142 draws a current from the voltage output terminal TO to prevent the output voltage Vo from becoming larger than the output voltage VH.

With the above-described operations, variations in an output voltage due to a delay in a response of the output voltage Vo may be prevented.

However, the background power supply circuits 100 and 100*a* as shown in FIGS. 1 and 2, respectively, cause a delay in a response with respect to a rapid change of the output current. When the power supply circuits 100 and 100*a* are used as a power source for driving a logic circuit such as a central processing unit (CPU), an output driver transistor having a large current supply capacity may be needed. If such output driver transistor is employed, the speed of response may be reduced as a gate capacity of the output driver transistor increases. A delay in a speed of response may cause substantial variations of an output voltage, which may result in a malfunction of the logic circuit serving as a load. To compensate the above-described drawback, the constant current source ia of FIG. 1 and the constant current source ib of FIG. 2 need to have a large electric current supply capacity, directing to an increase of the consumption current.

In FIG. 3, the background power supply circuit 100*b* controls the current sources 132 and 142 to maintain the relationship that the output voltage Vo of the voltage output terminal TO is smaller than the output voltage VH and is larger than the output voltage VL. While the relationship is maintained, the current sources 132 and 142 keep operating, consuming the current to increase an amount of consumption current, which substantially lowers a power supply efficiency.

SUMMARY

The present patent specification has been made in view of the above-described circumstances.

The present patent specification describes a novel power supply circuit capable of quickly responding to variations of an output voltage and effectively maintaining a speed of response to a load current.

The present patent specification describes a novel method of power supplying capable of quickly responding to variations of an output voltage and effectively maintaining a speed of response to a load current.

In one exemplary embodiment, a novel power supply circuit includes an output driver transistor, a reference voltage generator circuit, an output voltage detector circuit, an amplifier circuit, and a buffer circuit. The output driver transistor is configured to output a current in accordance with a first control signal input thereto. The reference voltage generator circuit is configured to generate and output a predetermined reference voltage. The output voltage detector circuit is configured to detect an output voltage and to output a divided voltage generated based on the output voltage. The amplifier circuit has a first polarity and a second polarity opposite to the first polarity and is configured to compare the predetermined reference voltage and the divided voltage and to output a second control signal. The buffer circuit is configured to receive the second control signal output by the amplifier circuit and to control the operation of the output driver transistor in accordance with the second control signal. The buffer circuit includes a first transistor having an output terminal which is grounded, and a second transistor being a load of the first transistor. The first and second transistors have a polarity same as the second polarity of the amplifier circuit.

The amplifier circuit may include a first amplifier configured to output a first output signal. The first amplifier may include a differential pair including a first pair of MOS transistors, a current mirror circuit including a second pair of MOS transistors and being a load of the differential pair, and a constant current source configured to supply a current to drive the differential pair and the current mirror circuit.

The amplifier circuit may further include a second amplifier configured to amplify the first output signal output by the first amplifier and to output a second output signal.

The output driver transistor may include a MOS transistor. The first transistor of the buffer circuit may have a drain grounded and a gate connected to an output terminal of the amplifying circuit.

The second transistor of the buffer circuit may be a transistor forming the current mirror circuit with the current mirror circuit of the amplifying circuit.

This specification also describes novel power supplying methodologies.

In one exemplary embodiment, a novel method for supplying power includes the steps of providing an output driver transistor, arranging an amplifier circuit having a first polarity and a second polarity opposite to the first polarity, providing a buffer circuit having first and second transistors having a polarity same as the second polarity of the amplifier circuit, generating a current in accordance with a control signal input to the output driver transistor, generating a predetermined reference voltage, obtaining a divided voltage based on the output voltage, comparing the predetermined reference voltage and the divided voltage in the amplifying circuit, outputting a comparison result to the buffer circuit, generating the control signal based on a comparison result, outputting the control signal to the output driver transistor, and controlling the current in accordance with the control signal.

The comparing step may include generating a first output signal based on the comparison result.

The comparing step may further include amplifying the first output signal to generate a second output signal.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
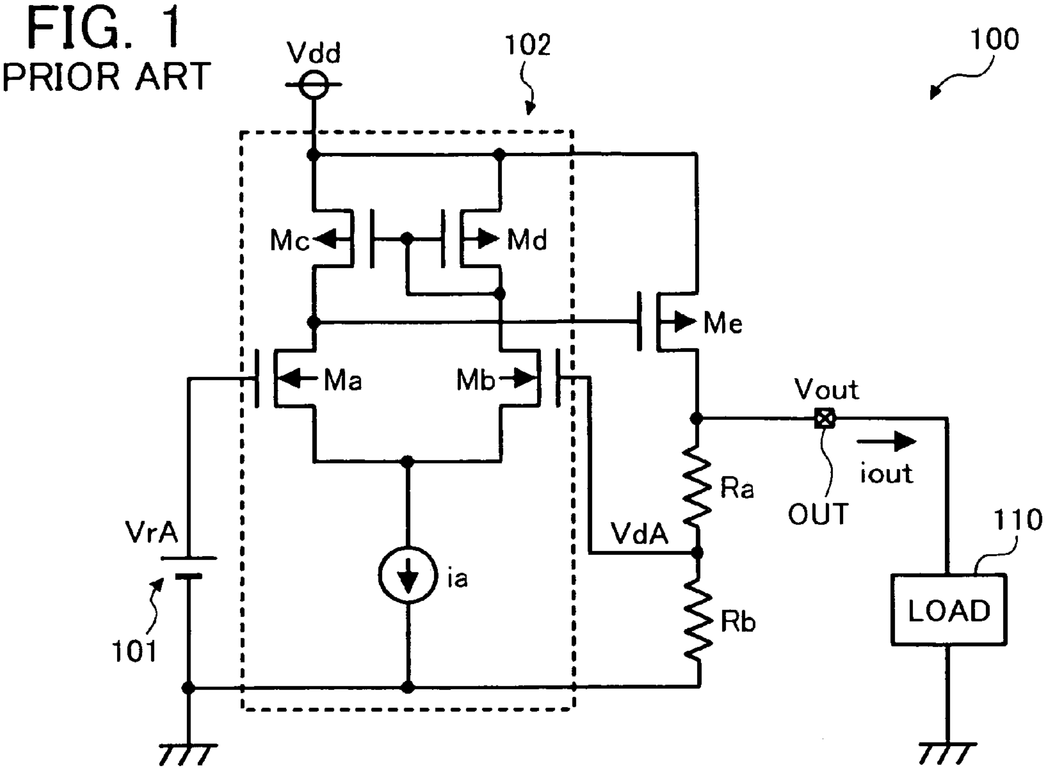
FIG. 1 PRIOR ART
FIG. 1 is a schematic circuit configuration of a background power supply circuit.
Figure 2:
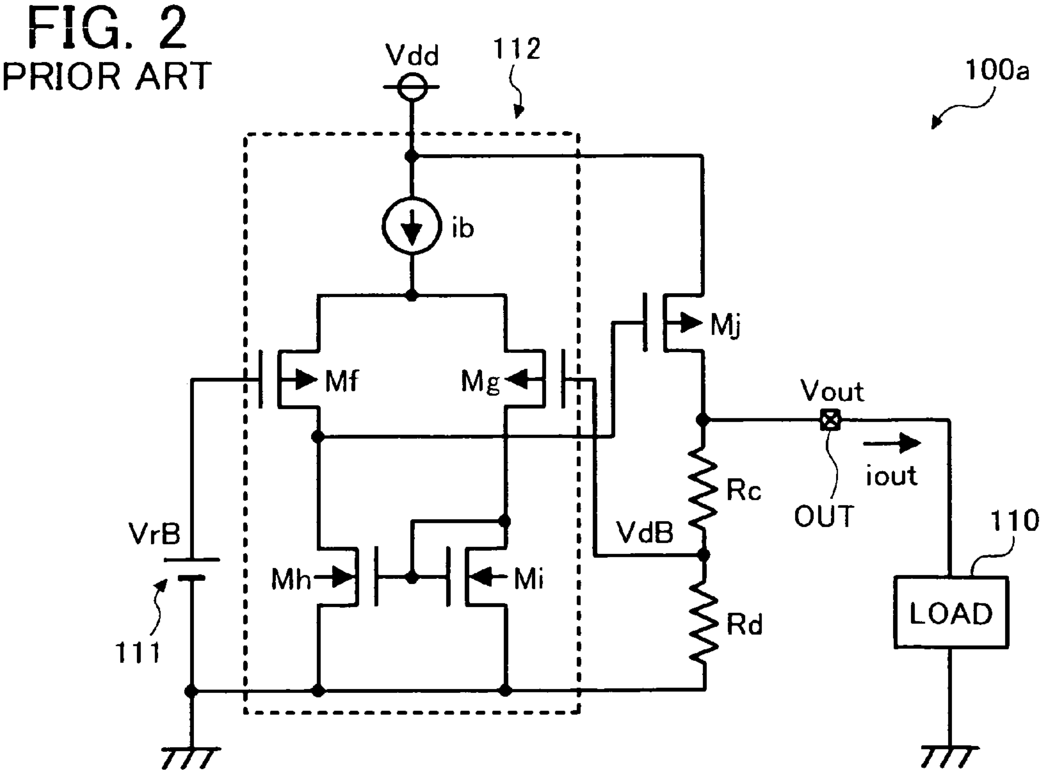
FIG. 2 PRIOR ART
FIG. 2 is a schematic circuit configuration of another background power supply circuit.
Figure 3:
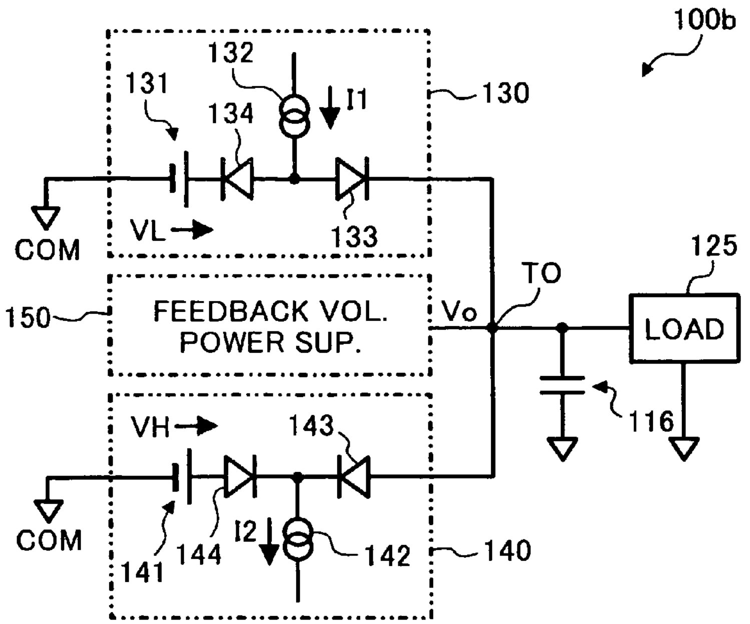
FIG. 3 PRIOR ART
FIG. 3 is a schematic circuit configuration of another background power supply circuit.

In describing preferred embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner.

Figure 4:
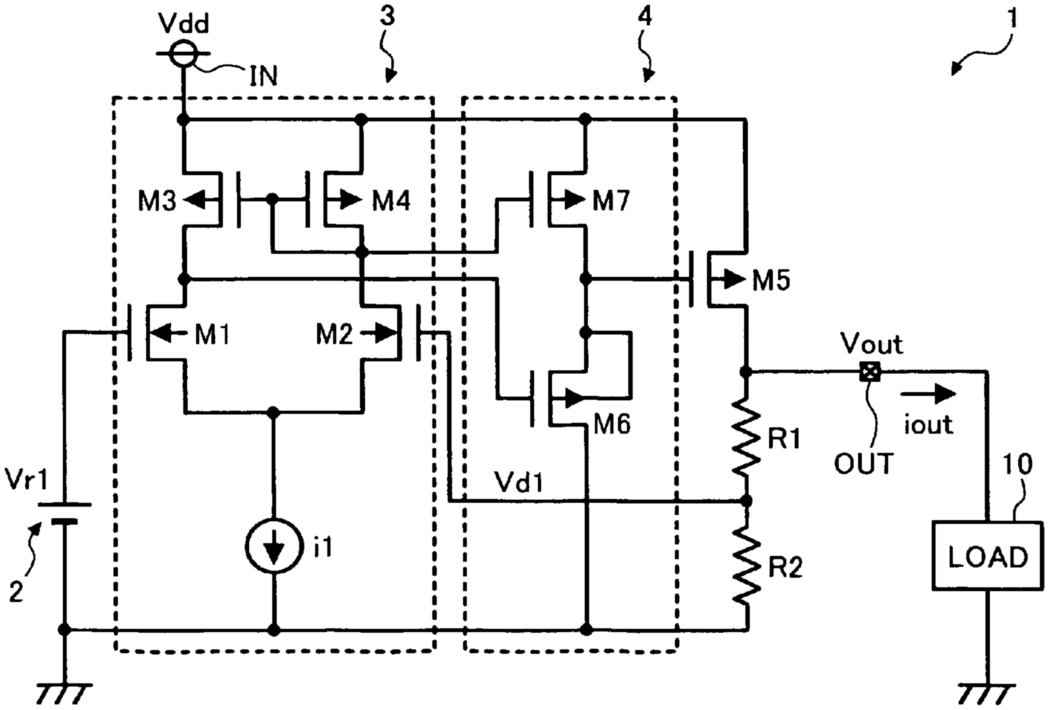
FIG. 4 is a schematic circuit configuration of a power supply circuit of an exemplary embodiment according to the present patent specification.

Referring now to the drawings, wherein like reference numerals designate identical or corresponding parts throughout the several views, and particularly to FIG. 4, a schematic circuit configuration of a power supply circuit 1 is described according to an exemplary embodiment of the present patent specification.

Referring to FIG. 4, a schematic circuit configuration of a power supply circuit 1 according to an exemplary embodiment of the present invention is now described.

The power supply circuit 1 of FIG. 4 is a series regulator in which a power supply voltage Vdd input through an input terminal IN is converted to a predetermined voltage to output as an output voltage Vout via an output terminal OUT.

In FIG. 4, the power supply circuit 1 includes a reference voltage generator 2, resistors R1 and R2, an error amplifier 3, a buffer circuit 4, and an output driver transistor M5.

The reference voltage generator 2 serves as a reference voltage generator circuit part. The reference voltage generator 2 generates and outputs a predetermined reference voltage Vr1.

The resistors R1 and R2 detect and divide the output voltage Vout to generate and output a divided voltage Vd1.

The error amplifier 3 compares the divided voltage Vd1 and the reference voltage Vr1, and outputs the comparison result. The error amplifier 3 controls the buffer circuit 4, which controls the output driver transistor M5.

The error amplifier 3 includes NMOS transistors Ml and M2 that form a differential pair, PMOS transistors M3 and M4 that form a current mirror circuit having a polarity opposite to the differential pair, and a constant current source i1 that supplies a current to the NMOS transistors M1 and M2 and the PMOS transistors M3 and M4.

In the error amplifier 3, the NMOS transistors M1 and M2 have respective sources connected to each other at their connecting point. The constant current source i1 is connected between the connecting point of the NMOS transistors M1 and M2 and a ground voltage. The reference voltage Vr1 is input to a gate of the NMOS transistor M1, and the divided voltage Vd1 is input to a gate of the NMOS transistor M2.

The PMOS transistors M3 and M4 have respective sources connected to the power supply voltage Vdd, and respective gates connected to each other at their connecting point. The connecting point of the PMOS transistors M3 and M4 is connected to a drain of the PMOS transistor M4.

The drain of the PMOS transistor M3 is connected to the drain of the NMOS transistor M1. The drain of the PMOS transistor M4 is connected to the drain of the NMOS transistor M2.

The buffer circuit 4 includes PMOS transistors M6 and M7 having a polarity same as the polarity of the PMOS transistors M3 and M4, and controls the output driver transistor M5 in accordance with the comparison result of the error amplifier 3. The PMOS transistor M6 forms a first transistor, and the PMOS transistor M7 forms a second transistor.

The PMOS transistors M6 and M7 are serially connected between the power supply voltage Vdd and the ground voltage. A gate of the PMOS transistor M6 is connected to a connecting point of the NMOS transistor M1 and the PMOS transistor M3. The connecting point of the NMOS transistor M1 and the PMOS transistor M3 is one of the outputs of the error amplifier 3. A gate of the PMOS transistor M7 is connected to a connecting point of the NMOS transistor M2 and the PMOS transistor M4. The connecting point of the NMOS transistor M2 and the PMOS transistor M4 is another of the outputs of the error amplifier 3.

The output driver transistor M5 is connected between the input terminal IN inputting the power supply voltage Vdd and an output terminal OUT. The output driver transistor MS outputs a current in accordance with a control signal input from the input terminal IN to the output terminal OUT.

The resistors R1 and R2 are serially connected between the output terminal OUT and the ground voltage. A gate of the output driver transistor M5 is connected to a connecting point of the PMOS transistors M6 and M7. A connecting point of the resistors R1 and R2 is connected to the gate of NMOS transistor M2.

A substrate gate of the PMOS transistor M6 is connected to a source of the PMOS transistor M6. A load 10 is connected between the output terminal OUT and a ground voltage.

Operations of the power supply circuit 1 are now described.

With the above-described circuit configuration, the error amplifier 3 and the buffer circuit 4, in the steady operation state, control the output driver transistor M5 to make the divided voltage Vd1 equal to the reference voltage Vr1, thereby stabilizing the output voltage Vout in a condition that a constant current is supplied to the load 10.

With the above-described condition, when an output current iout output from the output terminal OUT to the load 10 rapidly increases in the steady operation state, the output voltage Vout falls. A decreased amount of the output voltage Vout is divided by the resistors R1 and R2 to generate and output the divided voltage Vd1. The divided voltage Vd1 is fed back to the NMOS transistor M2 of the error amplifier 3, which turns off the NMOS transistor M2.

As previously described, the PMOS transistors M3 and M4 form a current mirror circuit. When a total amount of current output by the PMOS transistors M3 and M4 becomes smaller than an amount of current supplied by the constant current source i1, the power supply circuit 1 discharges a stored electric charge by an amount of current of the PMOS transistors M3 and M4 reduced as described above, from a capacitor of the gate of the PMOS transistor M6, which turns on the PMOS transistor M6.

A chip of the PMOS transistor M6 can be smaller than that of the output driver transistor M5. This may give a relatively small impact on a speed of response of the output voltage even when the current output from the constant current source i1 is relatively small. Moreover, the PMOS transistor M7 forms a current mirror circuit with the PMOS transistor M4. Therefore, a current output by the PMOS transistor M7 may be decreased.

A discharge of the electric charge of the PMOS transistor M6 and a reduction of current amount of the PMOS transistor M7 may trigger a decrease of amount of the electric charge of a gate capacity of the output driver transistor M5. This lowers the gate voltage of the output driver transistor M5 to control the output driver transistor M5 to turn on, which raises the output voltage Vout. Consequently, the output voltage Vout may be stabilized to make the divided voltage Vd1 and the reference voltage Vr1 equal to each other.

The steady current of the power supply circuit 1 is determined based on the current supplied by the constant current source i1. In addition, the PMOS transistor M7 forms a current circuit with the PMOS transistors M3 and M4. Therefore, even when variations in a quality of transistors occur in the process of manufacturing the transistors, substantial increase of a steady current and steep deterioration of response characteristics may be prevented.

As described above, the power supply circuit 1 uses two MOS transistors, which are the PMOS transistors M6 and M7, to realize a circuit controlling the output driver transistor M5 to charge and discharge at a high speed the gate capacity of the output driver transistor M5. With the above-described circuit configuration, the power supply circuit 1 may be arranged without a large increase of chip area. Further, the power supply circuit 1 may consume relatively low power, and have a relatively small adverse effect due to variations in quality of transistors occurring in a manufacturing process of transistors. Thereby, the power supply circuit 1 can quickly respond to rapid changes in a load current.

Further, the power supply circuit 1 may be provided with a plurality of common source amplification stages.

Figure 5:
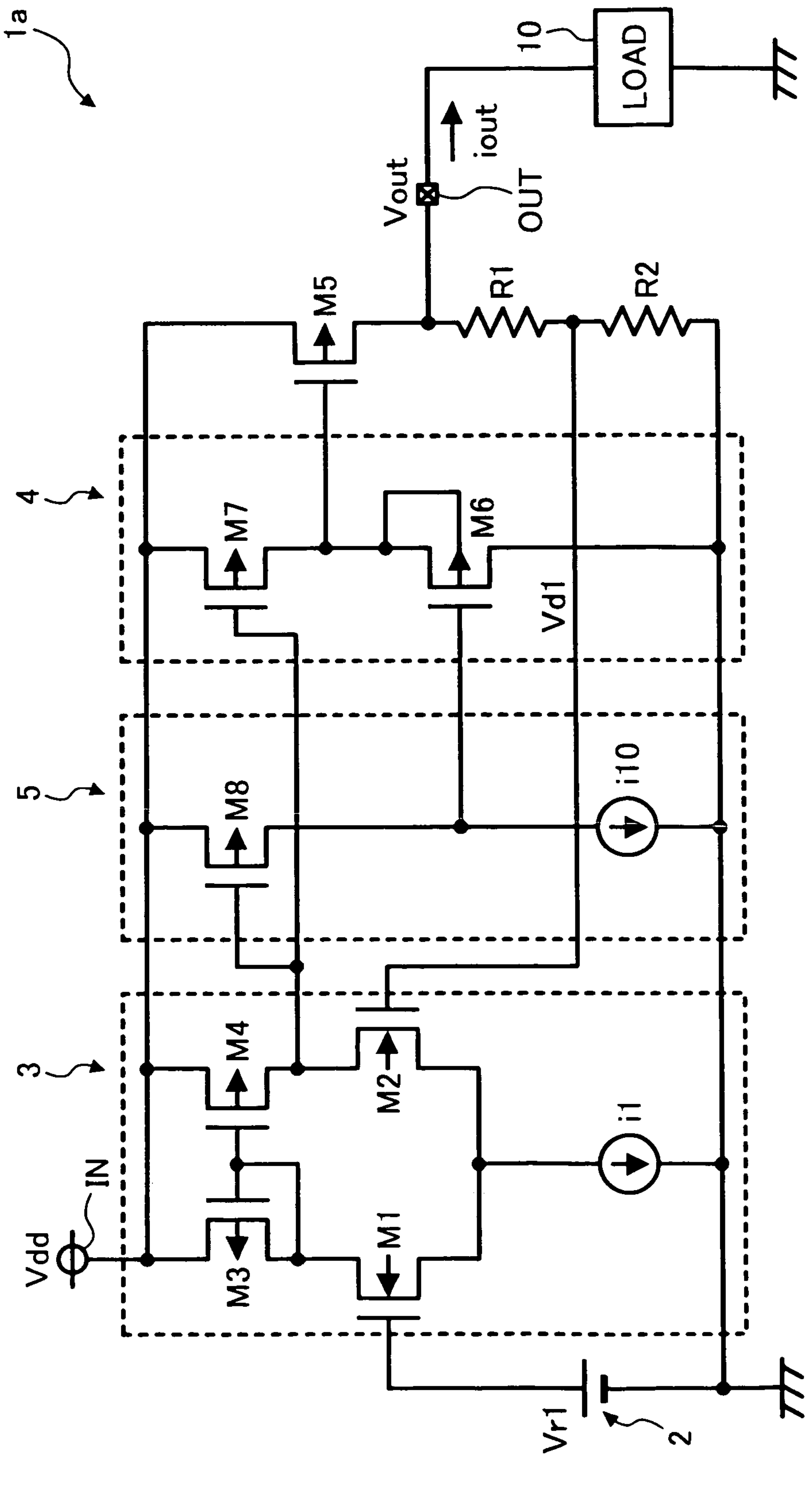
FIG. 5 is a schematic circuit configuration of a power supply circuit modified based on the power supply circuit of FIG. 4.

Referring to FIG. 5, a schematic circuit configuration of a power supply circuit 1*a* is described. The circuit configuration of FIG. 5 is a modified circuit configuration of FIG. 4. In FIG. 5, the same elements as those of FIG. 4 are referred to by the same numerals, and a description thereof is omitted. The following description is given of a difference between the power supply circuit 1 of FIG. 4 and the power supply circuit 1*a* of FIG. 5.

The power supply circuit la of FIG. 5 has a circuit configuration basically similar to the power supply circuit 1, except for an amplifier circuit 5.

The amplifier circuit 5 is a common source amplifier in addition to the error amplifier 3 and is provided between the error amplifier 3 and the buffer circuit 4. The amplifier circuit 5 includes a PMOS transistor M8 and a constant current source i10 to amplify an output signal generated by the error amplifier 3 and output the output signal to the buffer circuit 4.

The PMOS transistor M8 and the constant current source i10 are serially connected between a power supply voltage Vdd and a ground voltage. A gate of the PMOS transistor M8 is connected to a connecting point of the NMOS transistor M2 and the PMOS transistor M4. The connecting point of the NMOS transistor M2 and the PMOS transistor M4 is an output of the error amplifier 3. The connecting point of the PMOS transistor M8 and the constant current source i10 is connected to a gate of the PMOS transistor M6.

The power supply circuit 1*a* of FIG. 5 can provide the same effect as the power supply circuit 1 of FIG. 4. That is, the power supply circuit 1*a* including the two MOS transistors, the PMOS transistors M6 and M7, can control the output driver transistor M5 to charge and discharge at a high speed the gate capacity of the output driver transistor M5. The power supply circuit 1*a* may be formed without a large increase of chip area, consume relatively low power, and have a relatively small adverse effect due to variations in quality of transistors occurring in a manufacturing process of transistors. Thereby, the power supply circuit 1 can quickly respond to rapid changes in a load current.

Figure 6:
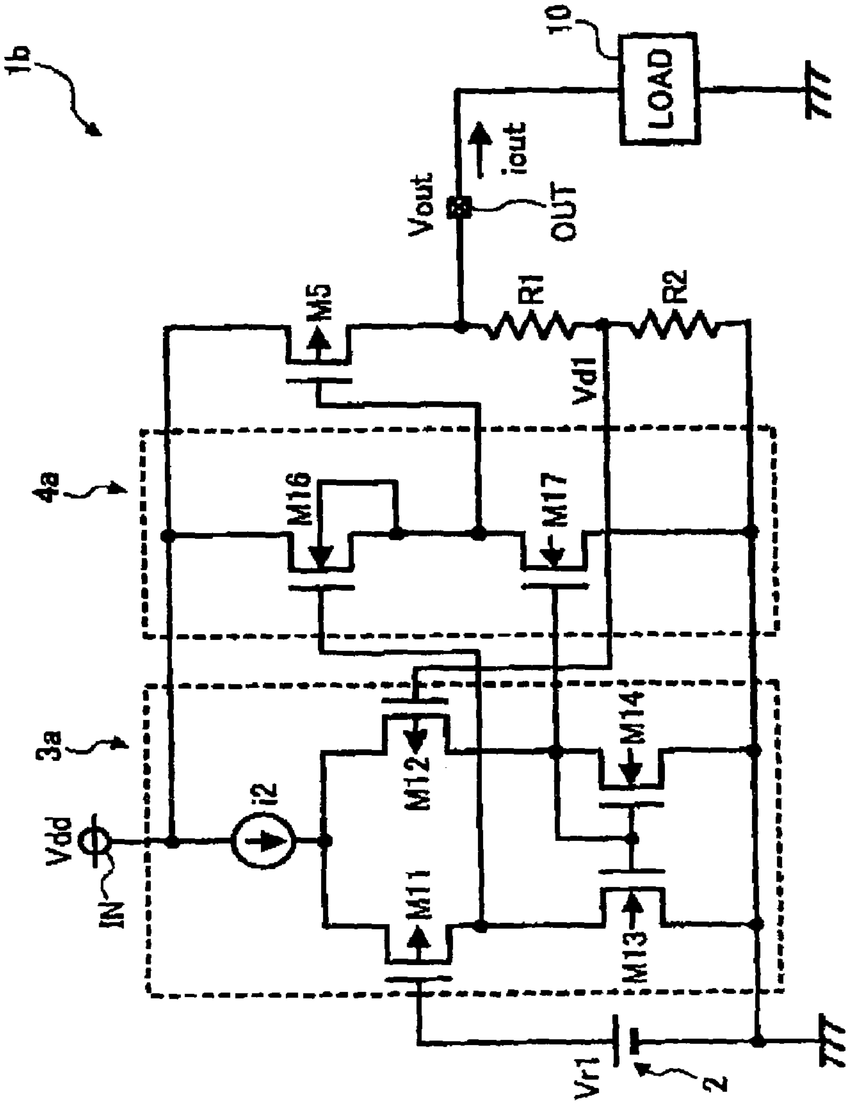
FIG. 6 is a schematic circuit configuration of a power supply circuit alternative to the power supply circuit of FIG. 4.

Referring to FIG. 6, a schematic circuit configuration of a power supply circuit 1*b* according to another exemplary embodiment of the present invention is now described.

The circuit configuration of FIG. 6 is based on the circuit configuration of FIG. 4. In FIG. 6, the same elements as those of FIG. 4 are referred to by the same numerals, and a description thereof is omitted.

The circuit configuration and function of the power supply circuit 1*b* of FIG. 6 are basically similar to those of the power supply circuit 1 of FIG. 4, except for an error amplifier 3*a* and a buffer circuit 4*a*.

The error amplifier 3*a* compares a divided voltage Vd1 and a reference voltage Vr1, and outputs the comparison result. The error amplifier 3*a* controls the buffer circuit 4*a*, which controls the output driver transistor M5.

The error amplifier 3*a* includes PMOS transistors M11 and M12 that form a differential pair, NMOS transistors M13 and M14 that form a current mirror circuit having a polarity opposite to the differential pair, and a constant current source i2 that supplies a current to the PMOS transistors M11 and M12 and the NMOS transistors M13 and M14.

In the error amplifier 3*a*, the PMOS transistors M11 and M12 have respective sources connected to each other at their connecting point. The constant current source i2 is connected between the connecting point of the PMOS transistors M11 and M12 and the power supply voltage Vdd. The reference voltage Vr1 is input to a gate of the PMOS transistor M11, and the divided voltage Vd1 is input to a gate of the PMOS transistor M12.

The NMOS transistors M13 and M14 have respective sources connected to a ground voltage, and respective gates connected to each other at their connecting point. The connecting point of the NMOS transistors M13 and M14 is connected to a drain of the NMOS transistor M14.

The drain of the NMOS transistor M13 is connected to the drain of the PMOS transistor M11. The drain of the NMOS transistor M14 is connected to the drain of the PMOS transistor M12.

The buffer circuit 4*a* includes NMOS transistors M16 and M17 having a polarity same as the NMOS transistors M13 and M14, and controls the output driver transistor M5 in accordance with the comparison result of the error amplifier 3*a*.

The NMOS transistors M16 and M17 are serially connected between the power supply voltage Vdd and the ground voltage. A gate of the NMOS transistor M16 is connected to a connecting point of the PMOS transistor M11 and the NMOS transistor M13. The connecting point of the PMOS transistor M11 and the NMOS transistor M13 is one of the outputs of the error amplifier 3*a*. A gate of the NMOS transistor M17 is connected to a connecting point of the PMOS transistor M12 and the NMOS transistor M14. The connecting point of the PMOS transistor M12 and the NMOS transistor M14 is another of the outputs ends of the error amplifier 3*a*.

The output driver transistor M5 is connected between the input terminal IN inputting the power supply voltage Vdd and an output terminal OUT. The output driver transistor M5 outputs a current in accordance with a control signal input from the input terminal IN to the output terminal OUT.

The resistors R1 and R2 are serially connected between the output terminal OUT and the ground voltage. A gate of the output driver transistor M5 is connected to the connecting point of the NMOS transistors M16 and M17. A connecting point of the resistors R1 and R2 is connected to the gate of PMOS transistor M12.

A substrate gate of the NMOS transistor M16 is connected to a source of the NMOS transistor M16.

Operations of the power supply circuit 1*b* are now described.

With the above-described circuit configuration, the error amplifier 3*a* and the buffer circuit 4*a*, in the steady operational state, control the output driver transistor M5 to make the divided voltage Vd1 equal to the reference voltage Vr1, thereby stabilizing the output voltage Vout in a condition that a constant current is supplied to a load 10.

With the above-described condition, when an output current iout output from the output terminal OUT to the load 10 rapidly decreases in the steady operation state, the output voltage Vout rises. An increased amount of the output voltage Vout is divided by the resistors R1 and R2 to generate and output a divided voltage Vd1. The divided voltage Vd1 is fed back to the PMOS transistor M12 of the error amplifier 3*a*, which turns off the PMOS transistor M12.

As previously described, the NMOS transistors M13 and M14 form a current mirror circuit. When a total amount of current output by the NMOS transistors M13 and M14 becomes smaller than an amount of current supplied by the constant current source i2, the power supply circuit 1*b* charges an electric charge by an amount of current of the NMOS transistors M13 and M14 reduced as described above, to a capacitor of the gate of the NMOS transistor M16, which turns on the NMOS transistor M16.

A chip of the NMOS transistor M16 can be smaller than that of the output driver transistor M5. This may give a relatively small impact on a speed of response of the output voltage even when the current output from the constant current source i2 is relatively small. Moreover, the NMOS transistor M17 forms a current mirror circuit with the NMOS transistor M14. Therefore, a current output by the NMOS transistor M17 may be decreased.

A charge of the electric charge of the NMOS transistor M16 and a reduction of current amount of the NMOS transistor M17 may trigger an increase of amount of the electric charge to be stored in a gate capacity of the output driver transistor M5. This increases the gate voltage of the output driver transistor M5 to control the output driver transistor M5 to turn off so that the output voltage Vout falls. Consequently, the output voltage Vout may be stabilized to make the divided voltage Vd1 and the reference voltage Vr1 equal to each other.

The steady current of the power supply circuit 1*b* is determined based on the current supplied by the constant current source i2. In addition, the NMOS transistor M17 forms a current circuit with the NMOS transistors M13 and M14. Therefore, even when variations in quality of transistors in a process of manufacturing the transistors, substantial increase of a steady current and steep deterioration of response characteristics may be prevented.

As described above, the power supply circuit 1*b* uses two MOS transistors, which are NMOS transistors M16 and M17, to realize a circuit controlling the output driver transistor M5 to charge and discharge at a high speed the gate capacity of the output driver transistor M5. With the above-described circuit configuration, the power supply circuit 1*b* may be arranged without a large increase of chip area. Further, the power supply circuit 1*b* may consume relatively low power, and have a relatively small adverse effect due to variations in quality of transistors occurring in a manufacturing process of transistors. Thereby, the power supply circuit 1*b* can quickly respond to rapid changes in a load current.

Further, the power supply circuit 1*b* of FIG. 5 may be provided with a plurality of common source amplification stages.

Figure 7:
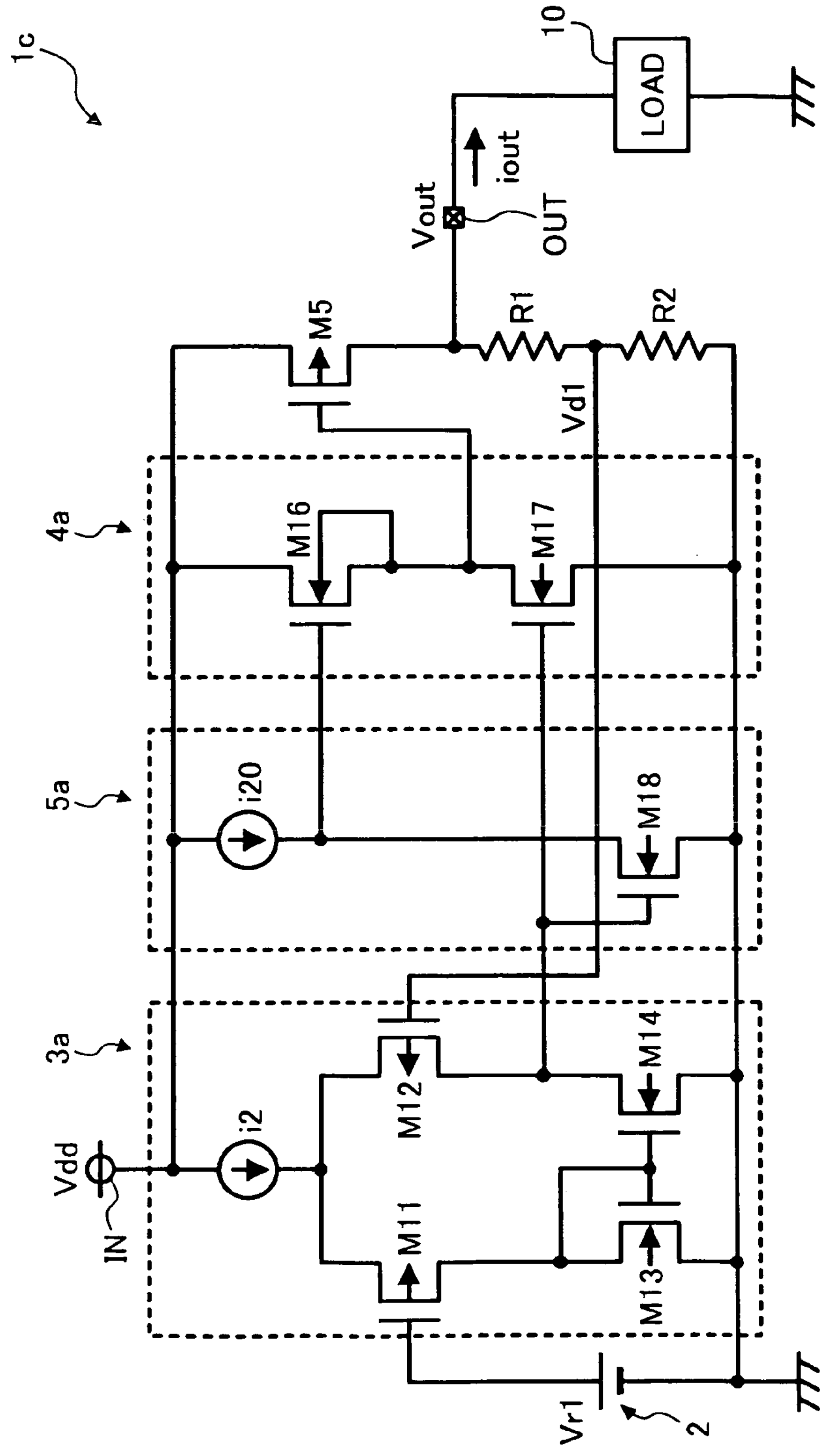
FIG. 7 is a schematic circuit configuration of a power supply circuit modified based on the power supply circuit of FIG. 6.

Referring to FIG. 7, a schematic circuit configuration of a power supply circuit 1*c* is described. The circuit configuration of FIG. 7 is a modified circuit configuration of FIG. 6. In FIG. 7, the same elements as those of FIG. 6 are referred to by the same numerals, and a description thereof is omitted. The following description is given of a difference between the power supply circuit 1*b* of FIG. 6 and the power supply circuit 1*c* of FIG. 7.

The power supply circuit 1*c* of FIG. 7 has a circuit configuration basically similar to the power supply circuit 1*b*, except for an amplifier circuit 5*a*.

The amplifier circuit 5*a* is a common source amplifier in addition to the error amplifier 3*a* and is arranged between the error amplifier 3*a* and the buffer circuit 4*a*. The amplifier circuit 5*a* includes a NMOS transistor M18 and a constant current source i20 to amplify an output signal generated by the error amplifier 3*a* and output the output signal to the buffer circuit 4*a*.

The NMOS transistor M18 and the constant current source i20 are serially connected between a power supply voltage Vdd and a ground voltage. A gate of the NMOS transistor M18 is connected to a connecting point of the PMOS transistor M12 and the NMOS transistor M14. The connecting point of the PMOS transistor M12 and the NMOS transistor M14 is an output of the error amplifier 3*a*. The connecting point of the NMOS transistor M18 and the constant current source i20 is connected to a gate of the NMOS transistor M16. The power supply circuit 1*c* of FIG. 7 can provide the same effect as the power supply circuit 1*b* of FIG. 6. That is, the power supply circuit 1*c* including the two MOS transistors, the NMOS transistors M16 and M17, can control the output driver transistor M5 to charge and discharge at a high speed the gate capacity of the output driver transistor M5. The power supply circuit 1*c* may be formed without a large increase of chip area, consumes relatively low power, and has a relatively small adverse effect due to variations in quality of transistors occurring in a manufacturing process of transistors. Thereby, the power supply circuit 1*c* can quickly respond to rapid changes in a load current.

The above-described embodiments are illustrative, and numerous additional modifications and variations are possible in light of the above teachings. For example, elements and/or features of different illustrative and exemplary embodiment herein may be combined with each other and/or substituted for each other within the scope of this disclosure and appended claims. It is therefore to be understood that within the scope of the appended claims, the disclosure of this patent specification may be practiced otherwise than as specifically described herein.

This patent specification is based on Japanese, Patent Application, No. 2004-000446 filed on Jan. 5, 2004 in the Japanese Patent Office, the entire contents of which are incorporated by reference herein.

What is claimed is:

1. A power supply circuit, comprising:

an output driver transistor configured to output a current in accordance with a first control signal input thereto;

a reference voltage generator circuit configured to generate and output a predetermined reference voltage;

an output voltage detector circuit configured to detect an output voltage and to output a divided voltage generated based on the output voltage;

an amplifier circuit having at least one transistor of a first polarity and at least one transistor of a second polarity opposite to the first polarity and configured to compare the predetermined reference voltage and the divided voltage and to output a second control signal; and a buffer circuit configured to receive the second control signal output by the amplifier circuit and to control the operation of the output driver transistor in accordance with the second control signal, to make the divided voltage substantially equal to the reference voltage, the buffer circuit comprising:

a first transistor having an output terminal which is grounded; and a second transistor being a load of the first transistor, the first and second transistors having a polarity same as the second polarity of the amplifier circuit, wherein the amplifier circuit includes a first current mirror circuit and a constant current source configured to supply a current to drive the first current mirror circuit, and wherein the second transistor of the buffer circuit forms a second current mirror circuit with the first current mirror circuit of the amplifying circuit.

2. The power supply circuit according to claim 1, wherein the amplifier circuit comprising:

a first amplifier configured to output a first output signal, the first amplifier comprising:

a differential pair including a first pair of MOS transistors;

a current mirror circuit including a second pair of MOS transistors and being a load of the differential pair; and a constant current source configured to supply a current to drive the differential pair and the current mirror circuit.

3. The power supply circuit according to claim 2, wherein the amplifier circuit further comprising:

a second amplifier configured to amplify the first output signal output by the first amplifier and to output a second output signal.

4. The power supply circuit according to claim 3, wherein the output driver transistor includes a MOS transistor, and wherein the first transistor of the buffer circuit has a drain grounded and a gate connected to an output terminal of the amplifying circuit.

5. The power supply circuit according to claim 1, wherein the second transistor of the buffer circuit forms the current mirror circuit with one of the at least one transistor of the second polarity of the amplifying circuit.

6. The power supply circuit of claim 1, wherein the current output from the output driver transistor is supplied to a load of the power supply circuit, the load causes the current to rapidly increase, the divided voltage decreases, and the amplifier circuit through the buffer circuit controls the output driver transistor to increase the output voltage.

7. The power supply circuit of claim 1, wherein the current output from the output means is supplied to a load of the power supply circuit, the load causes the current to rapidly increase, the divided voltage decreases, and the comparing means through the control means controls the output means to increase the output voltage.

8. A power supply circuit, comprising:

output means for outputting a current in accordance with a first control signal input thereto;

means for generating and outputting a predetermined reference voltage;

means for detecting an output voltage and outputting a divided voltage generated based on the output voltage;

comparing means having at least one transistor of a first polarity and at least one transistor of a second polarity opposite to the first polarity, for comparing the predetermined reference voltage and the divided voltage and outputting a second control signal; and control means for controlling the operation of the output means in accordance with the second control signal after receiving the second control signal output by the comparing means, to make the divided voltage substantially equal to the reference voltage, the control means comprising:

a first transistor having an output terminal which is grounded; and a second transistor being a load of the first transistor, the first and second transistors having a polarity same as the second polarity of the comparing means, wherein the comparing means includes a first current mirror circuit and a constant current source configured to supply a current to drive the first current mirror circuit, and wherein the second transistor of the control means forms a second current mirror circuit with the first current mirror circuit of the comparing means.

9. The power supply circuit according to claim 8, wherein the comparing means comprising:

first means for amplifying and outputting a first output signal, the first means for amplifying comprising:

a differential pair including a first pair of MOS transistors;

a current mirror circuit including a second pair of MOS transistors and being a load of the differential pair; and means for supplying a current to drive the differential pair and the current mirror circuit.

10. The power supply circuit according to claim 9, wherein the comparing means further comprising:

second means for amplifying the first output signal output by the first means for amplifying, and outputting a second output signal.

11. The power supply circuit according to claim 8, wherein the means for outputting includes a MOS transistor, and wherein the first transistor of the means for controlling has a drain grounded and a gate connected to an output terminal of the comparing means.

12. A method of power supplying, comprising the steps of:

providing an output driver transistor;

arranging an amplifier circuit having at least one transistor of a first polarity and at least one transistor of a second polarity opposite to the first polarity, wherein the amplifier circuit includes a first current mirror circuit and a constant current source configured to supply a current to drive the first current mirror circuit;

providing a buffer circuit having first and second transistors having a polarity same as the second polarity of the amplifier circuit, said first transistor having an output terminal which is grounded, and said second transistor being a load of the first transistor, wherein the second transistor of the buffer circuit forms a second current mirror circuit with the first current mirror circuit of the amplifier circuit;

generating a current in accordance with a control signal input to the output driver transistor;

generating a predetermined reference voltage;

obtaining a divided voltage based on the output voltage;

comparing the predetermined reference voltage and the divided voltage in the amplifying circuit;

outputting a comparison result to the buffer circuit;

generating the control signal based on a comparison result;

outputting the control signal to the output driver transistor; and controlling the current in accordance with the control signal.

13. The method according to claim 12, wherein the comparing further comprising the step of:

issuing a first output signal based on the comparison result.

14. The method according to claim 13, wherein the comparing further comprising the step of:

amplifying the first output signal to output a second output signal.

* * * * *